US012610837B2

(12) United States Patent
Zhou et al.

(10) Patent No.: US 12,610,837 B2
(45) Date of Patent: Apr. 21, 2026

(54) LATERALLY MOUNTED AND PACKAGED STRUCTURE AND MANUFACTURING METHOD THEREOF

(71) Applicant: LUXSHARE ELECTRONIC TECHNOLOGY (KUNSHAN) LTD., Kunshan City (CN)

(72) Inventors: Xiaolei Zhou, Kunshan City (CN); Yong Zhou, Kunshan City (CN); Wenbin Kang, Kunshan City (CN)

(73) Assignee: LUXSHARE ELECTRONIC TECHNOLOGY (KUNSHAN) LTD., Kunshan City (CN)

( * ) Notice: Subject to any disclaimer, the term of this patent is extended or adjusted under 35 U.S.C. 154(b) by 702 days.

(21) Appl. No.: 17/830,712

(22) Filed: Jun. 2, 2022

(65) Prior Publication Data
US 2023/0223321 A1    Jul. 13, 2023

(30) Foreign Application Priority Data
Jan. 10, 2022    (CN) .......................... 202210020974.0

(51) Int. Cl.
*H10W 70/65*        (2026.01)
*H10W 70/05*        (2026.01)
(52) U.S. Cl.
CPC ....... *H10W 70/657* (2026.01); *H10W 70/093* (2026.01); *H10W 70/65* (2026.01)
(58) Field of Classification Search
CPC ............... H01L 25/0657; H01L 21/561; H01L 23/49805; H01L 23/49838;
(Continued)

(56) References Cited

U.S. PATENT DOCUMENTS 5,763,943 A * 6/1998 Baker ................. H01L 25/0652
257/725
6,153,928 A * 11/2000 Cho ........................ H01L 23/13
257/692
(Continued)

FOREIGN PATENT DOCUMENTS

CN            1231106 C      12/2005
CN        101587847 A      11/2009
(Continued)

OTHER PUBLICATIONS

Machine Translation of CN-112002679-A (Year: 2020).*
(Continued)

*Primary Examiner* — David Chen
(74) *Attorney, Agent, or Firm* — Birch, Stewart, Kolasch & Birch, LLP

(57) ABSTRACT

A manufacturing method includes performing imposition on at least two discrete double-side packaged structures such that lateral electrical connection structures located on the same side of each of the at least two discrete double-side packaged structures are coplanar; and electrically mounting a first component onto lateral electrical connection structures on the first side, where a double-side packaged structure includes a substrate, the lateral electrical connection structures are formed on the first face and the second face of the substrate, and the first face is opposite to the second face and is adjacent to the first side.

7 Claims, 14 Drawing Sheets

(58) Field of Classification Search
     CPC ......... H01L 23/49827; H01L 21/4853; H10W
                       70/657; H10W 70/093; H10W 70/65
     USPC .......................... 438/107, 108, 109, 110, 113
     See application file for complete search history.

(56)                    References Cited

U.S. PATENT DOCUMENTS

| | | | |
|---|---|---|---|
| 2016/0260686 A1* | 9/2016 | Kimura | H01L 25/16 |
| 2017/0263543 A1* | 9/2017 | Bang | H01L 23/49805 |
| 2018/0026010 A1* | 1/2018 | Huang | H01L 23/5386 |
| | | | 257/659 |
| 2018/0040544 A1 | 2/2018 | Katkar et al. | |
| 2019/0067248 A1* | 2/2019 | Yoo | H01L 24/13 |
| 2020/0203253 A1* | 6/2020 | Sakakibara | H01L 21/4882 |

FOREIGN PATENT DOCUMENTS

| | | |
|---|---|---|
| CN | 104900544 A | 9/2015 |
| CN | 109003948 A | 12/2018 |
| CN | 112002679 A | 11/2020 |
| JP | 2015-72231 A | 4/2015 |

OTHER PUBLICATIONS

"Study on Stacking Packaging and Assembling Technology", 71 pages.
Chinese Office Action and Search Report for Chinese Application No. 202210020974.0, dated Jan. 12, 2025, with an English translation.

* cited by examiner

First side of a double-side packaged structure

First face of a double-side packaged structure

Second face of a double-side packaged structure

Jig

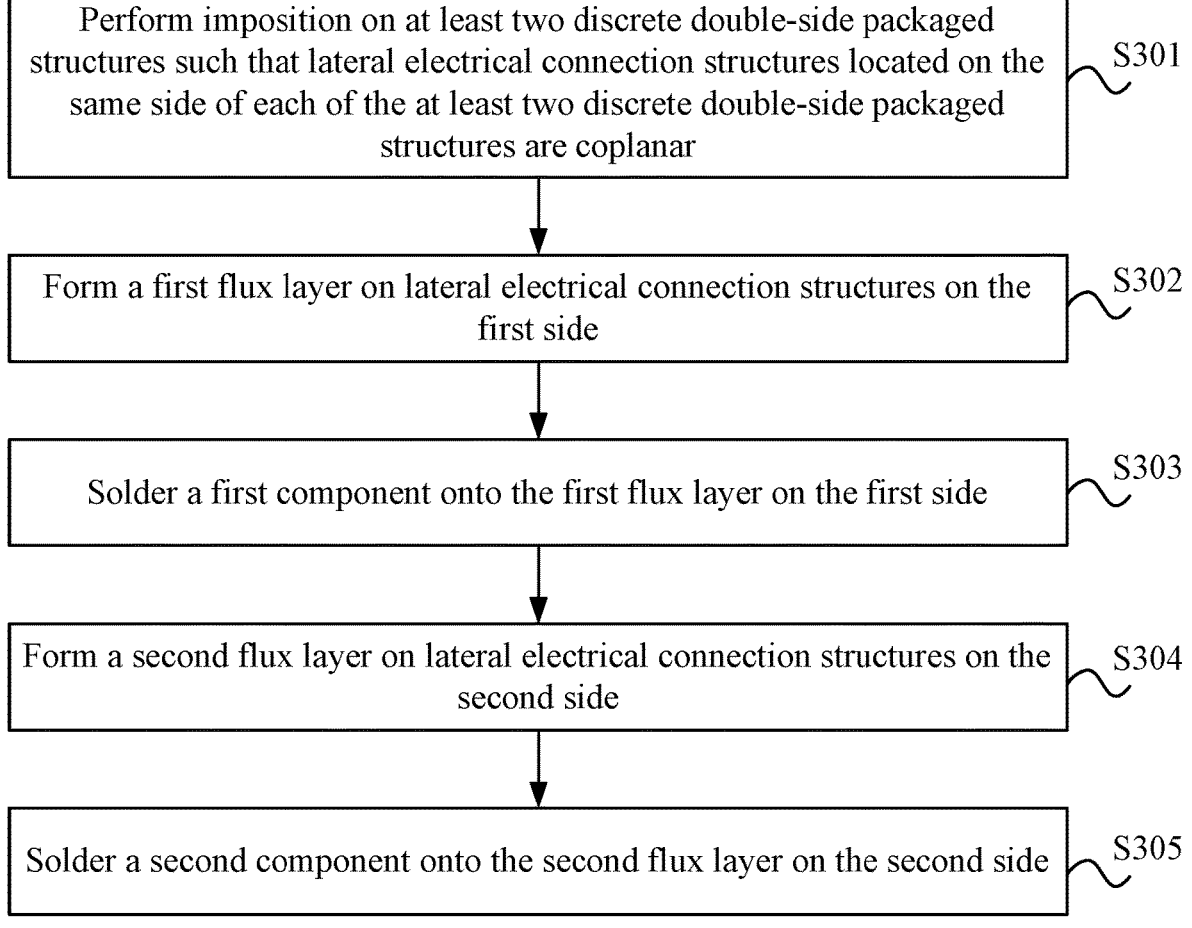

Perform imposition on at least two discrete double-side packaged structures such that lateral electrical connection structures located on the same side of each of the at least two discrete double-side packaged structures are coplanar          S301

Form a first flux layer on lateral electrical connection structures on the first side          S302

Solder a first component onto the first flux layer on the first side          S303

Form a second flux layer on lateral electrical connection structures on the second side          S304

Solder a second component onto the second flux layer on the second side          S305

FIG.8

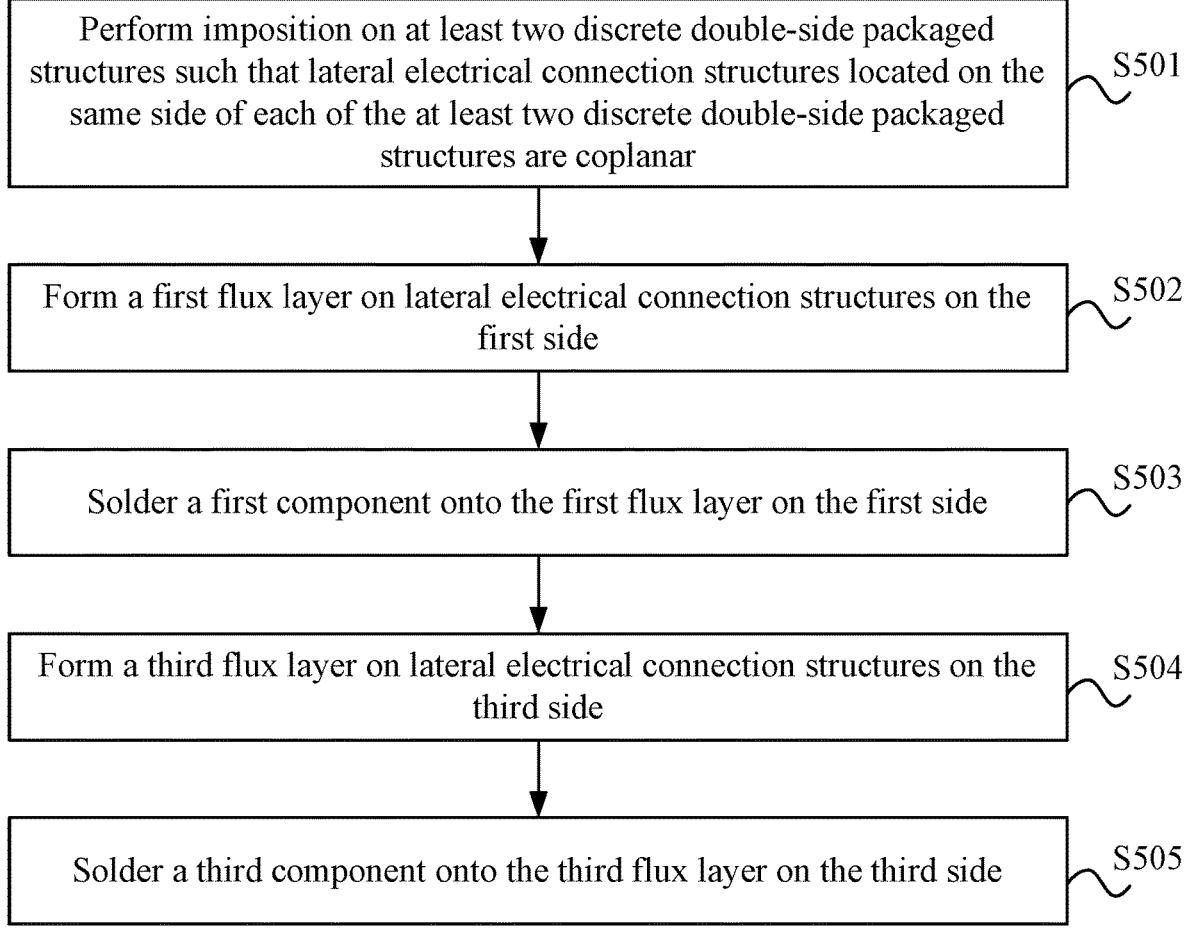

Perform imposition on at least two discrete double-side packaged structures such that lateral electrical connection structures located on the same side of each of the at least two discrete double-side packaged structures are coplanar     S501

Form a first flux layer on lateral electrical connection structures on the first side     S502

Solder a first component onto the first flux layer on the first side     S503

Form a third flux layer on lateral electrical connection structures on the third side     S504

Solder a third component onto the third flux layer on the third side     S505

FIG. 11

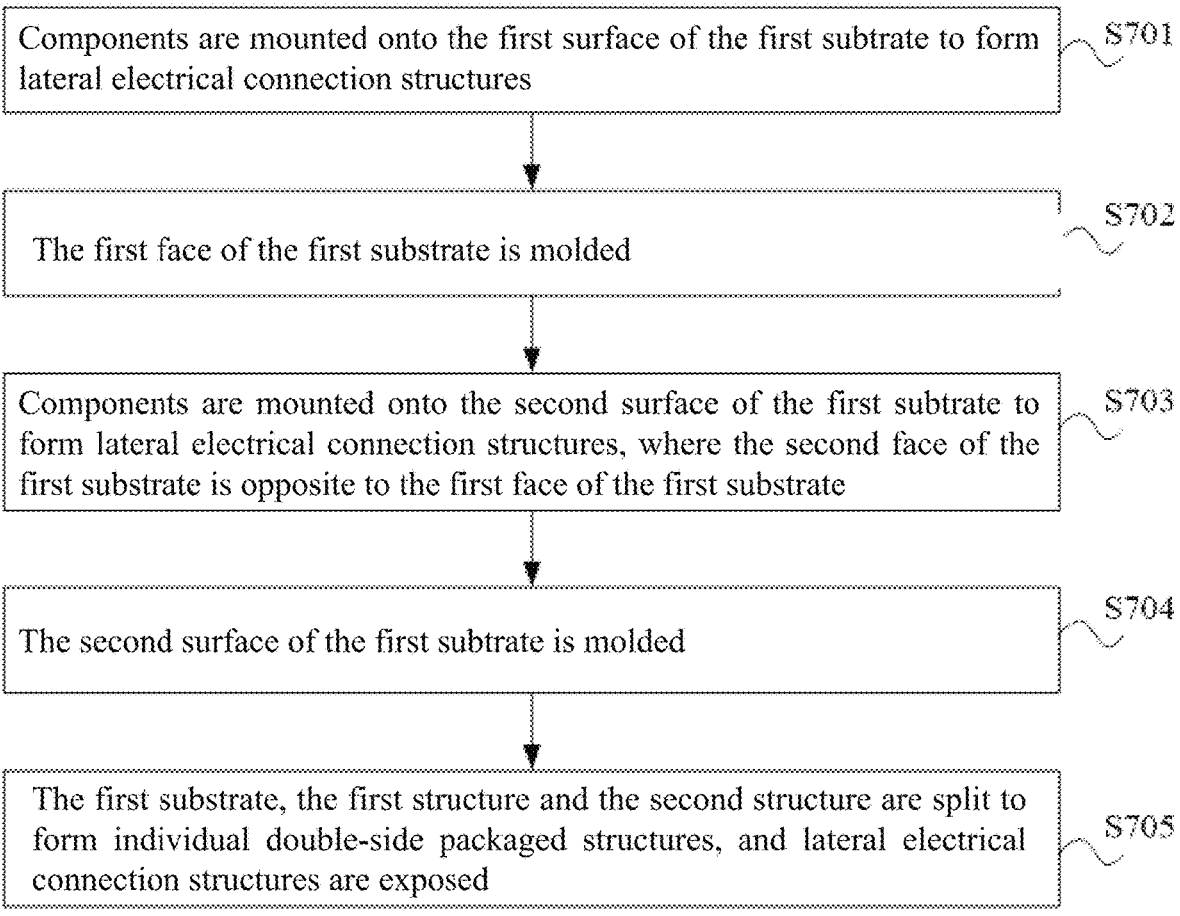

| Components are mounted onto the first surface of the first subtrate to form lateral electrical connection structures | S701 |

| The first face of the first substrate is molded | S702 |

| Components are mounted onto the second surface of the first subtrate to form lateral electrical connection structures, where the second face of the first substrate is opposite to the first face of the first substrate | S703 |

| The second surface of the first subtrate is molded | S704 |

| The first substrate, the first structure and the second structure are split to form individual double-side packaged structures, and lateral electrical connection structures are exposed | S705 |

FIG. 16

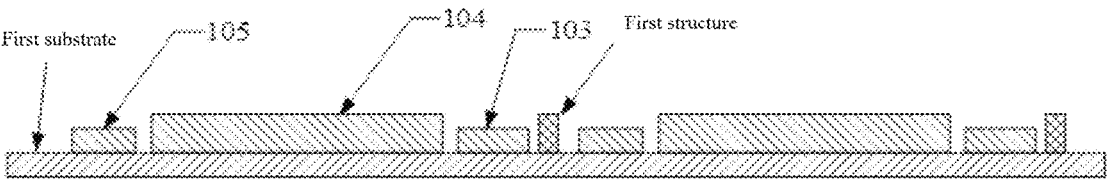

First substrate    105    104    103    First structure

FIG. 17

LATERALLY MOUNTED AND PACKAGED STRUCTURE AND MANUFACTURING METHOD THEREOF

CROSS-REFERENCE TO RELATED APPLICATION(S)

This application claims priority to Chinese Patent Application No. 202210020974.0 filed on Jan. 10, 2022, the disclosure of which is incorporated herein by reference in its entirety.

TECHNICAL FIELD

The present disclosure relates to the chip packaging technologies and, in particular, to a laterally mounted and packaged structure and a manufacturing method thereof.

BACKGROUND

With the continuous development of semiconductor technologies, electronic packages are becoming smaller and smaller. To satisfy the diverse application demands of a product, the space utilization of the product needs to be improved as much as possible by mounting as many components as possible into a certain space, so the packaging methods are becoming multidimensional.

In the related art, for example, in CN1231106C, contact points are reserved on the sides of a substrate, and a lateral element is connected to the substrate via a resilient connector, resulting in a larger volume and a single applicable range, and making it impossible to satisfy the development requirements of packaging: smaller and lighter. At present, a package is designed to be smaller and smaller, and the thickness of the substrate is greatly thin, so an enough large area of contact points is not available.

SUMMARY

Embodiments of the present disclosure provide a laterally mounted and packaged structure and a manufacturing method thereof so that lateral electrical connection structures on the substrate can be electrically led out to the first side of a double-side packaged structure, and the first side is mounted with a first component, thus forming a laterally mounted and packaged structure.

In a first aspect, embodiments of the present disclosure provide a manufacturing method of a laterally mounted and packaged structure. The method includes the steps below.

Imposition is performed on at least two discrete double-side packaged structures such that lateral electrical connection structures located on the same side of each of the at least two discrete double-side packaged structures are coplanar. A first component is electrically mounted onto lateral electrical connection structures on a first side. A double-side packaged structure includes a substrate. The lateral electrical connection structures are respectively formed on a first face and a second face of the substrate. The first face is opposite to the second face and is adjacent to the first side.

In a second aspect, embodiments of the present disclosure provide a laterally mounted and packaged structure. The laterally mounted and packaged structure includes a double-side packaged structure. The double-side packaged structure includes a substrate and lateral electrical connection structures. The lateral electrical connection structures are respectively formed on a first face and a second face of the substrate. At least part of the lateral electrical connection structures are located on a first side. The first face is opposite to the second face and is adjacent to the first side.

The laterally mounted and packaged structure further includes a first component located on the first side. The first component is electrically mounted onto the lateral electrical connection structures on the first side.

BRIEF DESCRIPTION OF DRAWINGS

FIG. 8 is a flowchart of a manufacturing method of another laterally mounted and packaged structure according to embodiments of the present disclosure.

FIG. 11 is a flowchart of a manufacturing method of another laterally mounted and packaged structure according to embodiments of the present disclosure.

FIG. 16 is a flowchart of a manufacturing method of a double-side packaged structure according to embodiments of the present disclosure.

FIGS. 17 to 22 are views illustrating a manufacturing process of a double-side packaged structure according to embodiments of the present disclosure.

DETAILED DESCRIPTION

Figure 1:
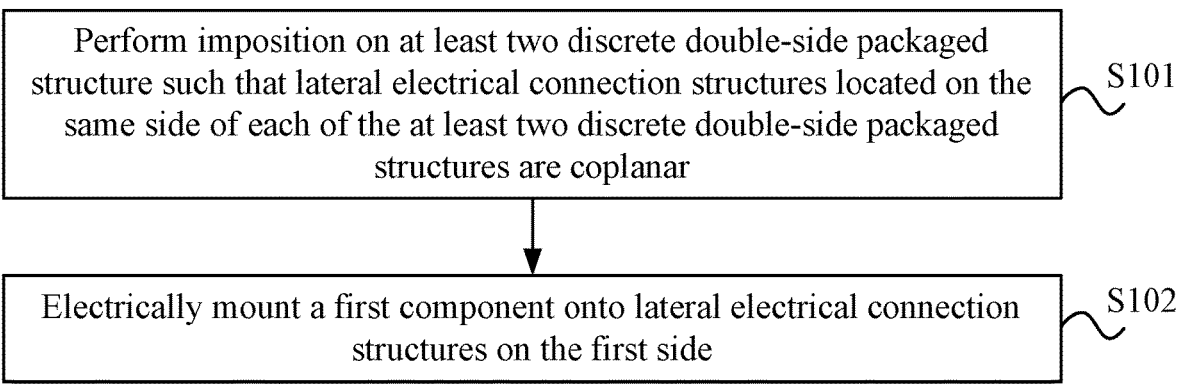
FIG. 1 is a flowchart of a manufacturing method of a laterally mounted and packaged structure according to embodiments of the present disclosure.

The present disclosure is further described hereinafter in detail in conjunction with drawings and embodiments. It is to be understood that the embodiments described herein are merely intended to explain the present disclosure. Additionally, it is to be noted that for ease of description, only part, not all, of the structures related to the present disclosure are illustrated in the drawings.

Figure 5:
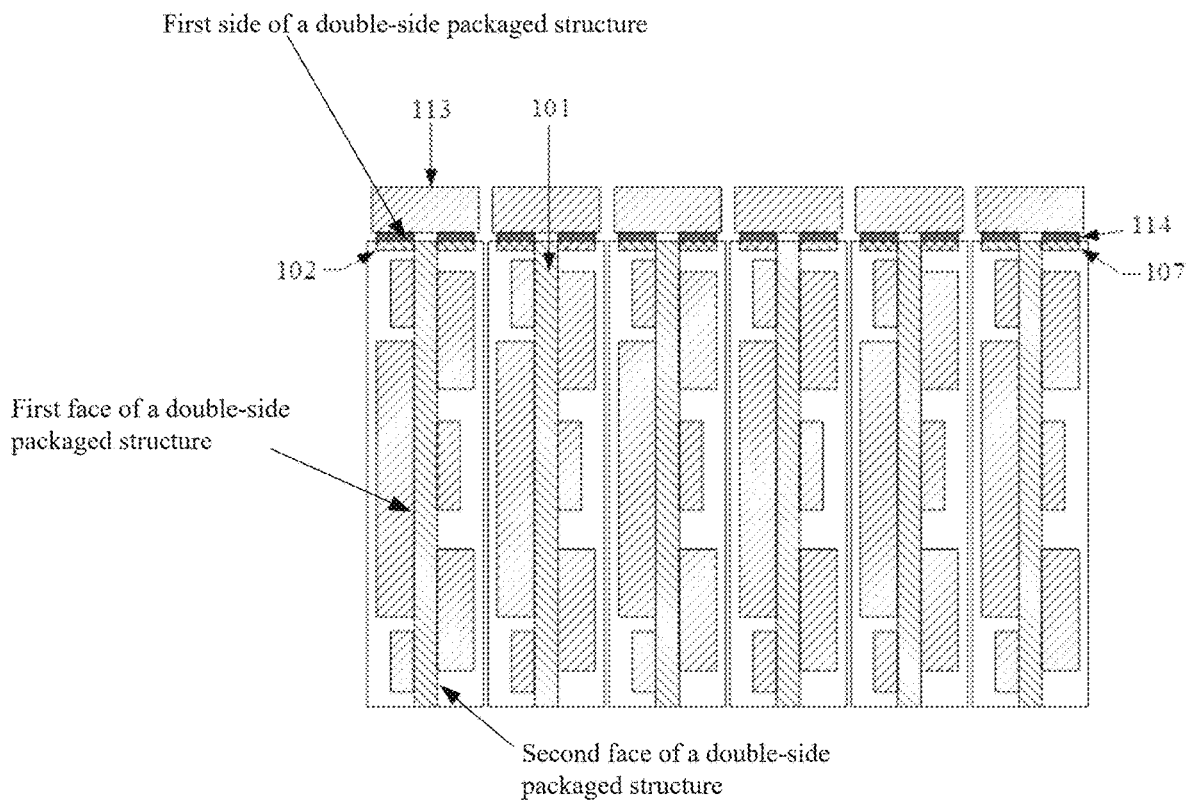

FIG. 1 is a flowchart of a manufacturing method of a laterally mounted and packaged structure according to embodiments of the present disclosure. FIGS. 3 to 5 are views illustrating a manufacturing process of a laterally mounted and packaged structure according to embodiments of the present disclosure. Referring to FIGS. 2 to 5, the manufacturing method of a laterally mounted and packaged structure includes the steps below.

In S101, imposition is performed on at least two discrete double-side packaged structures such that lateral electrical connection structures located on the same side of each of the at least two discrete double-side packaged structures are coplanar.

Referring to FIG. 3, six double-side packaged structures are used as an example for illustration. Imposition is performed on multiple double-side packaged structures according to the row direction.

Referring to FIG. 3, a double-side packaged structure includes a substrate 101. Lateral electrical connection structures are respectively formed on a first face of the substrate 101 and a second face of the substrate 101 individually, and the first face is opposite to the second face. In other embodiments, the lateral electrical connection structures may be formed on the first face of the substrate 101 or the second face of the substrate 101. The lateral electrical connection structure disposed on the first face of the substrate 101 is denoted as the first-face lateral electrical connection structure 102, and the lateral electrical connection structure disposed on the second face of the substrate 101 is denoted as the second-face lateral electrical connection structure 107.

Referring to FIG. 3, a first side of the double-side packaged structure is provided with the first-face lateral electrical connection structure 102 and the second-face lateral electrical connection structure 107. The first-face lateral electrical connection structure 102 located on the first side and the second-face lateral electrical connection structure 107 located on the first side are coplanar. The first side is adjacent to the first face and the second face and is one side face of the substrate 101.

Referring to FIG. 3, the double-side packaged structure includes the substrate 101. The lateral electrical connection structures are formed on the first face of the substrate 101 and the second face of the substrate 101. The first face is opposite to the second face, and is adjacent to the first side.

In S102, a first component 113 is electrically mounted onto lateral electrical connection structures on the first side.

Referring to FIG. 5, the first component 113 is mounted onto the first-face lateral electrical connection structure 102 on the first side and the second-face lateral electrical connection structure 107 on the first side.

In the manufacturing method of a laterally mounted and packaged structure provided by the embodiments of the present disclosure, the imposition is performed on the at least two discrete double-side packaged structures such that the lateral electrical connection structures located on the same side of each of the at least two discrete double-side packaged structures are coplanar, one of the lateral electrical connection structures on the substrate 101 is electrically led out to the first side of a respective double-side packaged structure, and the first side is mounted with the first component 113 so that a laterally mounted and packaged structure is formed.

In other embodiments, a second side face may be mounted with a second component, a third side face may be mounted with a third component, and a fourth side face may be mounted with a fourth component. Alternatively, at least two of the first component, the second component, the third component and the fourth component are mounted.

Components (including the first component, the second component, the third component and the fourth component) may be mounted in various manners, for example, surface mounting, flip-chip bonding and wire bonding. Embodiments are illustrated using an example in which a component is mounted onto a side face by being reflowed by use of a flux.

Figure 2:
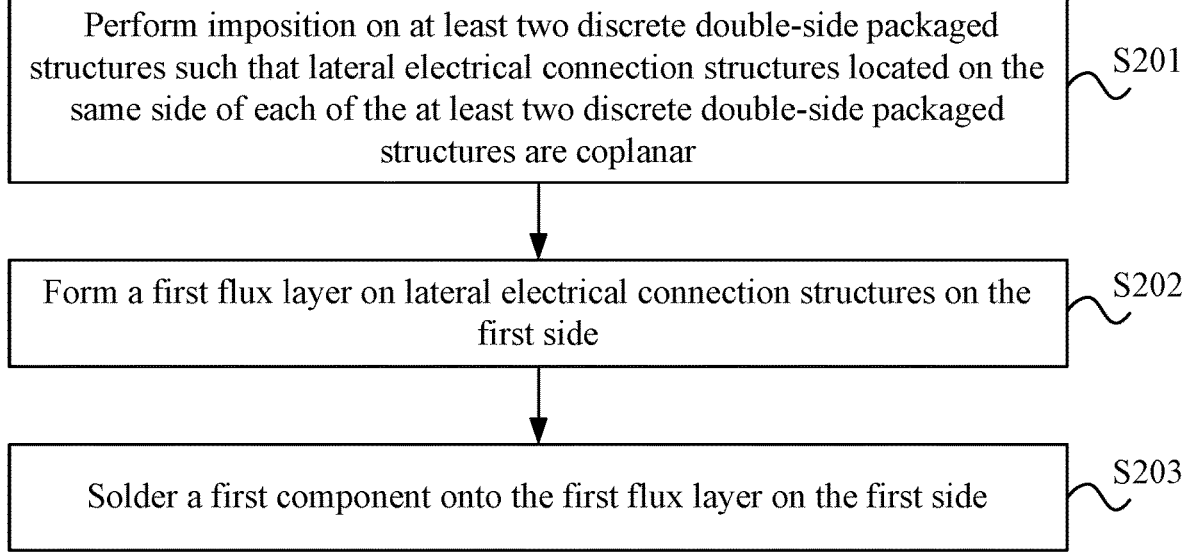
FIG. 2 is a flowchart of a manufacturing method of another laterally mounted and packaged structure according to embodiments of the present disclosure.
Figures 3, 4:
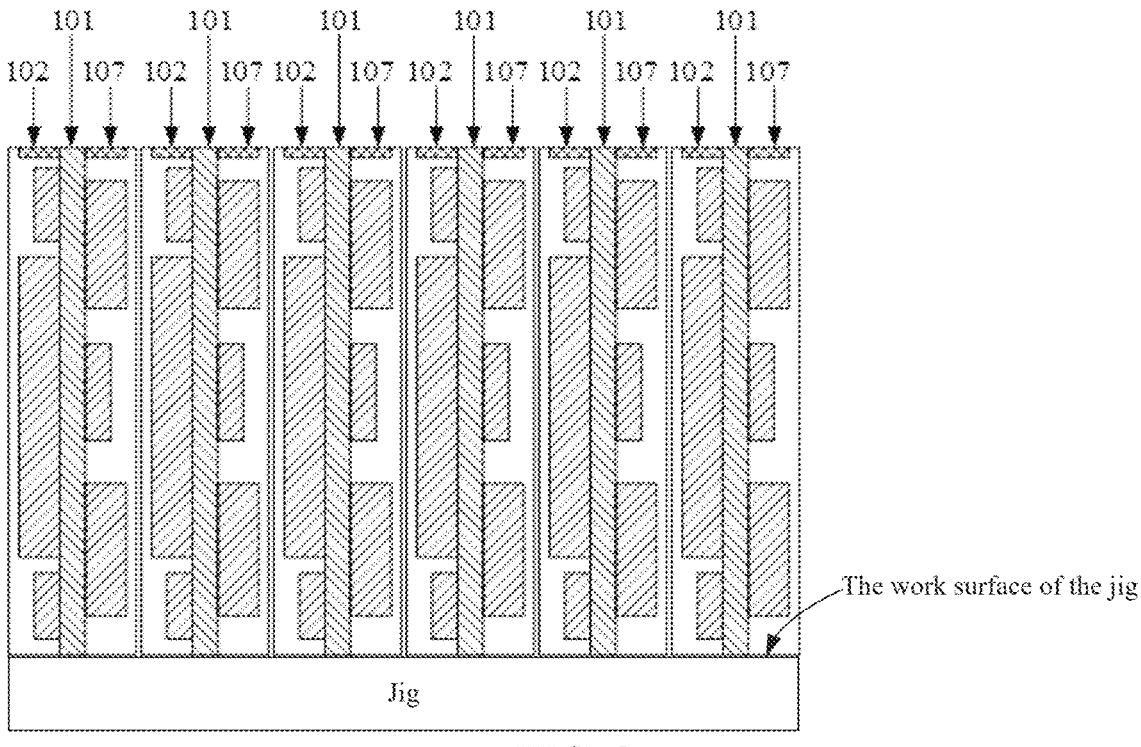
FIGS. 3 to 5 are views illustrating a manufacturing process of a laterally mounted and packaged structure according to embodiments of the present disclosure.

FIG. 2 is a flowchart of a manufacturing method of another laterally mounted and packaged structure according to embodiments of the present disclosure. FIGS. 3 to 5 are views illustrating a manufacturing process of a laterally mounted and packaged structure according to embodiments of the present disclosure. Referring to FIGS. 2 to 5, the manufacturing method of a laterally mounted and packaged structure includes the steps below.

In S201, imposition is performed on at least two discrete double-side packaged structures such that lateral electrical connection structures located on the same side of each of the at least two discrete double-side packaged structures are coplanar.

In S202, a first flux layer 114 is formed on lateral electrical connection structures on a first side.

Referring to FIG. 4, the first flux layer 114 is formed on the first-face lateral electrical connection structure 102 on the first side and the second-face lateral electrical connection structure 107 on the first side by use of such manners as tin printing, tin spraying or flux coating.

In S203, a first component 113 is soldered onto the first flux layer 114 on the first side.

Referring to FIG. 5, the first component 113 is mounted onto the first flux layer 114 on the first side and then is reflowed so that the first component 113 is fully in contact with the first-face lateral connection structure 102 and the second-face lateral electrical connection structure 107, thus completing the electrical connection and fixation.

In the manufacturing method of a laterally mounted and packaged structure provided by the embodiments of the present disclosure, the imposition is performed on the at least two discrete double-side packaged structures such that the lateral electrical connection structures located on the same side of each of the at least two discrete double-side packaged structures are coplanar, the first flux layer 114 is formed on the lateral electrical connection structures on the first side, and the first component 113 is soldered onto the first flux layer 114 on the first side so that one of the lateral electrical connection structures on the substrate 101 can be electrically led out to the first side of a respective double-side packaged structure, and the first side is mounted with the first component 113, thus forming a laterally mounted and packaged structure.

Optionally, the preceding step S201 may be refined into the following steps: The at least two discrete double-side packaged structures are placed into a jig, and the imposition is performed by use of the jig such that the lateral electrical connection structures in the double-side packaged structures located on the same side are coplanar.

Optionally, referring to FIG. 3, the substrate 101 is perpendicular to a work surface of the jig. Therefore, the substrate 101 may be secured by use of the jig so that damage to the components on the substrate 101 can be prevented.

Figure 6:
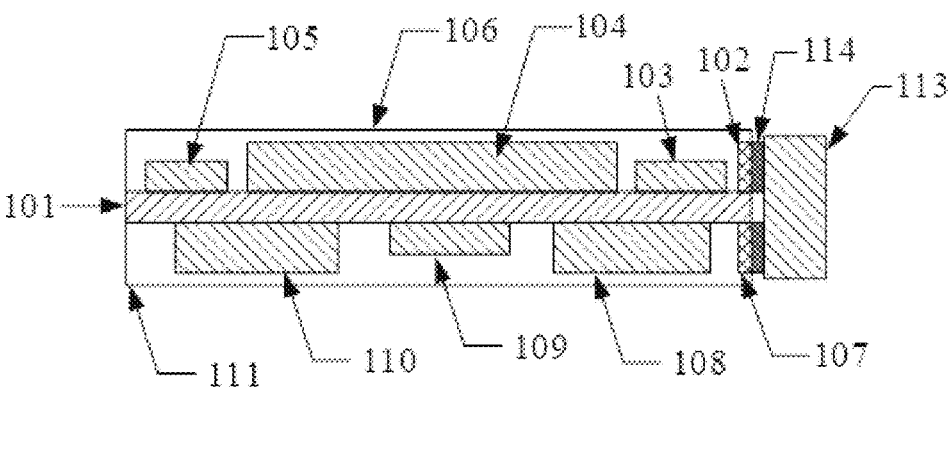
FIG. 6 is a front view illustrating a laterally mounted and packaged structure according to embodiments of the present disclosure.
Figure 7:
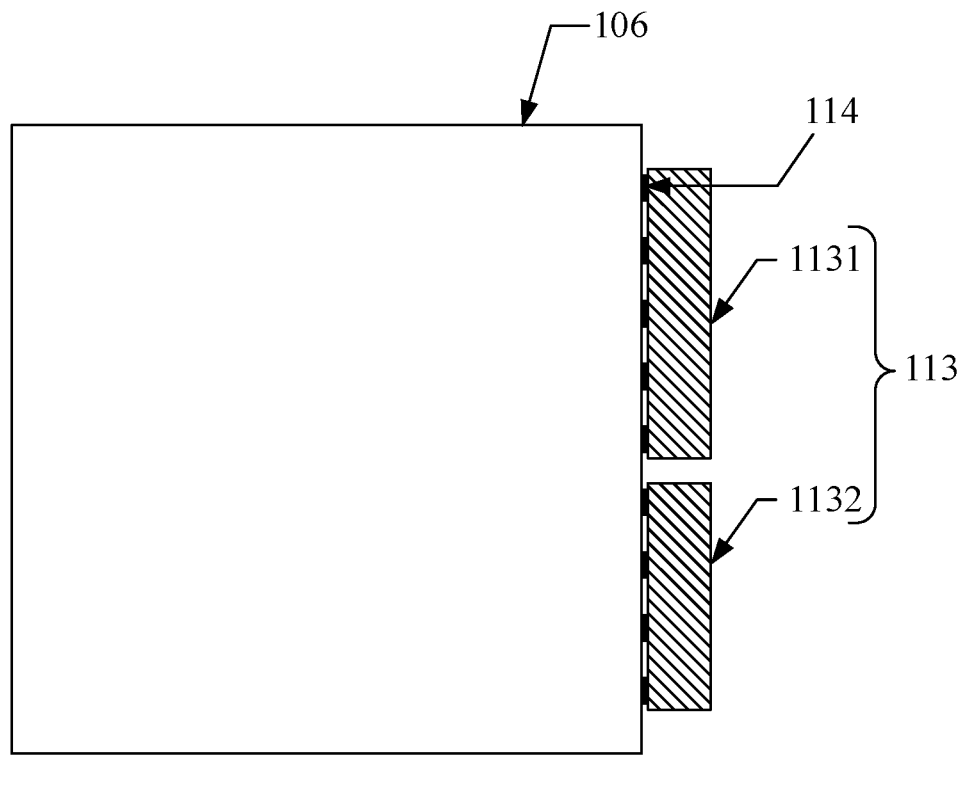
FIG. 7 is a top view of the laterally mounted and packaged structure of FIG. 6.

Optionally, after the preceding step S203, the manufacturing method of a laterally mounted and packaged structure further includes that the laterally mounted and packaged structures formed by being laterally mounted are moved away from the jig. That is, after the first component 113 is laterally mounted, the jig for securing the product is moved, and the formed laterally mounted and packaged structure array is taken out of the jig by use of such manners as an automatic picker or a mechanical arm to form individual laterally mounted and packaged structures as shown in FIGS. 6 and 7.

Figure 9:
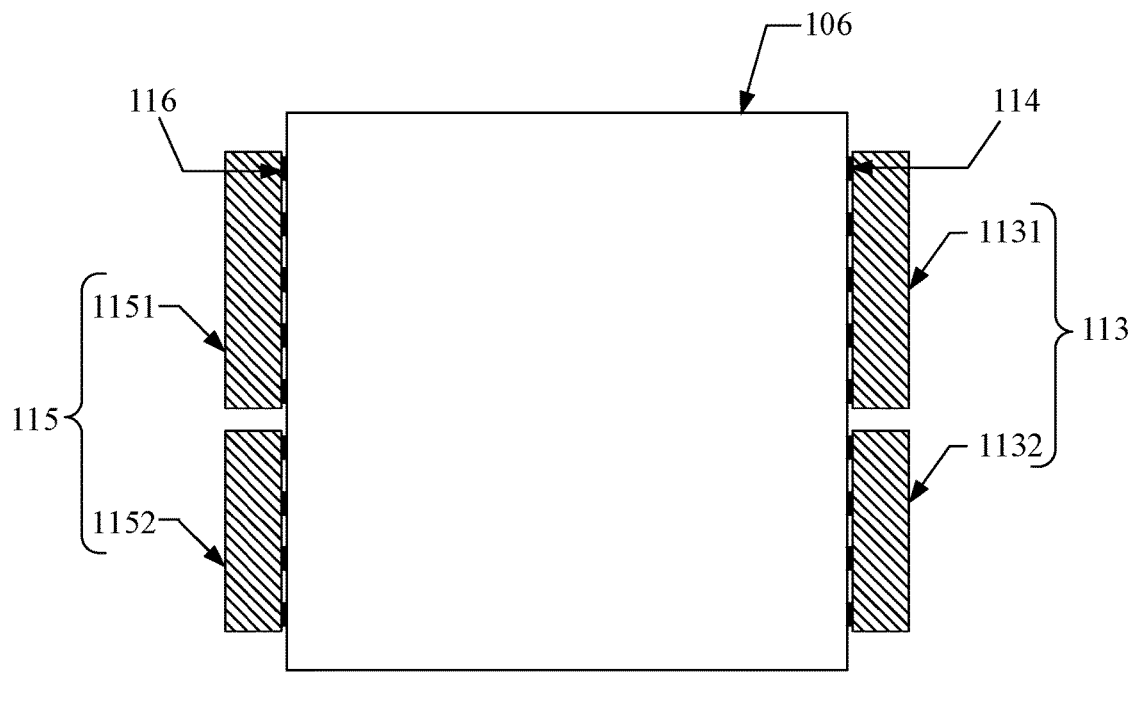
FIG. 9 is a top view illustrating another laterally mounted and packaged structure according to embodiments of the present disclosure.

FIG. 8 is a flowchart of a manufacturing method of another laterally mounted and packaged structure according to embodiments of the present disclosure. FIG. 9 is a top view illustrating another laterally mounted and packaged structure according to embodiments of the present disclosure. Referring to FIGS. 8 and 9, the manufacturing method of a laterally mounted and packaged structure includes the steps below.

In S301, imposition is performed on at least two discrete double-side packaged structures such that lateral electrical connection structures located on the same side of each of the at least two discrete double-side packaged structures are coplanar.

In S302, a first flux layer 114 is formed on lateral electrical connection structures on a first side.

In S303, a first component 113 is soldered onto the first flux layer 114 on the first side.

In S304, a second flux layer 116 is formed on lateral electrical connection structures on a second side.

Referring to FIG. 9, the second flux layer 116 is formed on the lateral electrical connection structures on the second side by use of such manners as tin printing, tin spraying or flux coating. The second side is opposite to the first side.

In S305, a second component 115 is soldered onto the second flux layer 116 on the second side.

Referring to FIG. 9, the second component 115 is mounted onto the second flux layer 116 on the second side and then is reflowed so that the second component 115 is fully in contact with the lateral electrical connection structures 102 on the second side, thus completing the electrical connection and fixation.

In this embodiment of the present disclosure, after the first component 113 is soldered onto the first flux layer 114 on the first side, the second flux layer 116 is formed on the lateral electrical connection structures on the second side, and the second component 115 is soldered onto the second flux layer 116 on the second side. Therefore, the first side is mounted with the first component 113, and the second side is mounted with the second component 115 so that a laterally mounted and packaged structure whose two opposite side faces are each mounted with the components is formed.

Figure 10:
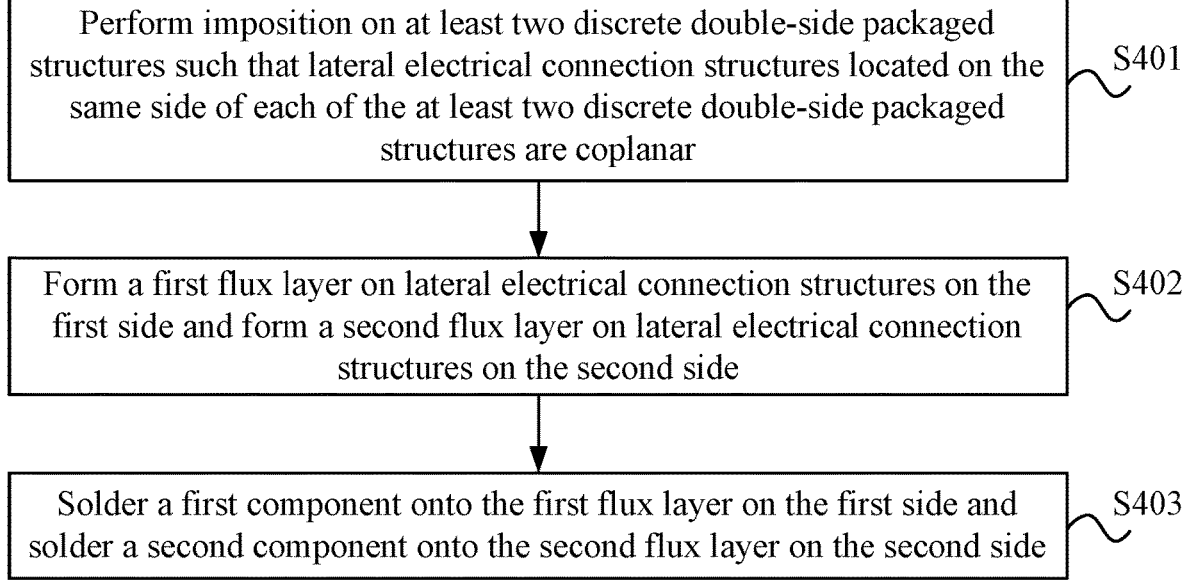
FIG. 10 is a flowchart of a manufacturing method of another laterally mounted and packaged structure according to embodiments of the present disclosure.

FIG. 10 is a flowchart of a manufacturing method of another laterally mounted and packaged structure according to embodiments of the present disclosure. Referring to FIGS. 9 and 10, the manufacturing method of a laterally mounted and packaged structure includes the steps below.

In 401, imposition is performed on at least two discrete double-side packaged structures such that lateral electrical connection structures located on the same side of each of the at least two discrete double-side packaged structures are coplanar.

In S402, a first flux layer 114 is formed on lateral electrical connection structures on a first side, and a second flux layer 116 is formed on lateral electrical connection structures on a second side.

In S403, a first component 113 is soldered onto the first flux layer 114 on the first side, and a second component 115 is soldered onto the second flux layer 116 on the second side.

In this embodiment of the present disclosure, after the first flux layer 114 is formed on the lateral electrical connection structures on the first side, and the second flux layer 116 is formed on the lateral electrical connection structures on the second side, the first component 113 is soldered onto the first flux layer 114 on the first side, and the second component 115 is soldered onto the second flux layer 116 on the second side. Therefore, the first side is mounted with the first component 113, and the second side is mounted with the second component 115 so that a laterally mounted and packaged structure is formed.

Figure 12:
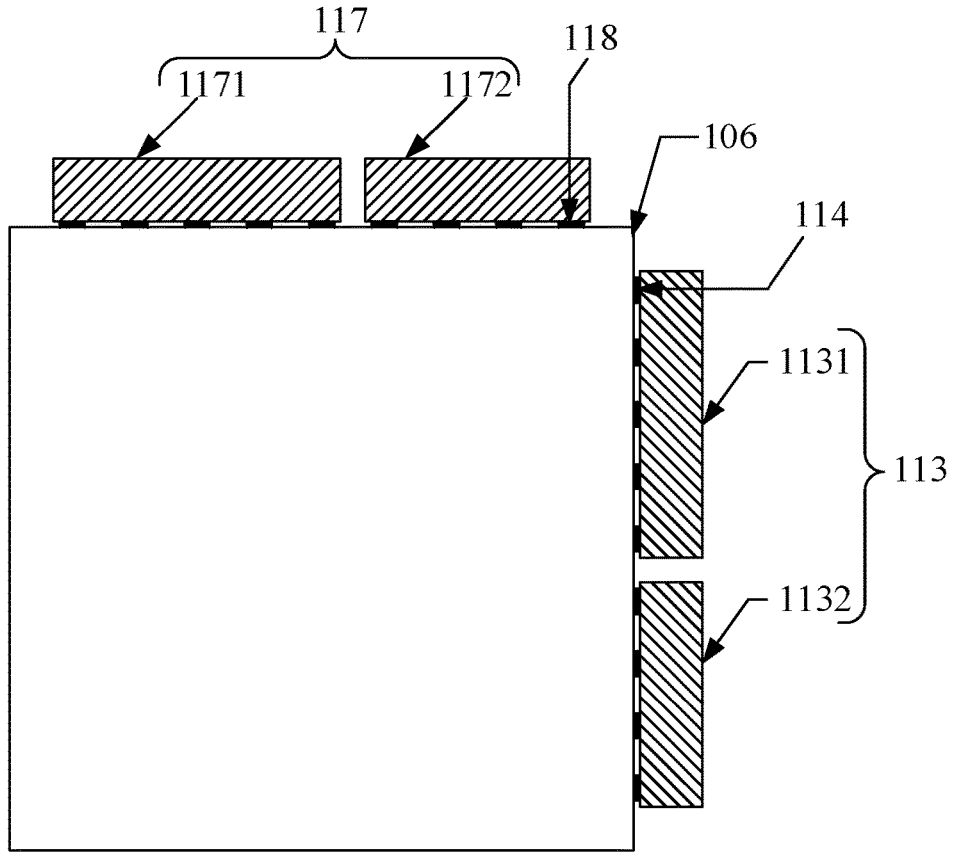
FIG. 12 is a top view illustrating another laterally mounted and packaged structure according to embodiments of the present disclosure.

FIG. 11 is a flowchart of a manufacturing method of another laterally mounted and packaged structure according to embodiments of the present disclosure. FIG. 12 is a top view illustrating another laterally mounted and packaged structure according to embodiments of the present disclosure. Referring to FIGS. 11 and 12, the manufacturing method of a laterally mounted and packaged structure includes the steps below.

In S501, imposition is performed on at least two discrete double-side packaged structures such that where lateral electrical connection structures located on the same side of each of the at least two discrete double-side packaged structures are coplanar.

In S502, a first flux layer 114 is formed on lateral electrical connection structures on a first side.

In S503, a first component 113 is soldered onto the first flux layer 114 on the first side.

In S504, a third flux layer 118 is formed on lateral electrical connection structures on a third side.

Referring to FIG. 12, the third flux layer 118 is formed on the lateral electrical connection structures on the third side by use of such manners as tin printing, tin spraying or flux coating. The third side is adjacent to the first side.

In S505, a third component 117 is soldered onto the third flux layer 118 on the third side.

Referring to FIG. 12, the third component 117 is mounted onto the third flux layer 118 on the third side and then is reflowed so that the third component 117 is fully in contact with the lateral electrical connection structures on the third side, thus completing the electrical connection and fixation.

In this embodiment of the present disclosure, after the first component 113 is soldered onto the first flux layer 114 on the first side, the third flux layer 118 is formed on the lateral electrical connection structures on the third side, and the third component 117 is soldered onto the third flux layer 118 on the third side. Therefore, the first side is mounted with the first component 113, and the third side is mounted with the third component 117 so that a laterally mounted and packaged structure whose two adjacent side faces are each mounted with the components is formed.

Figure 13:
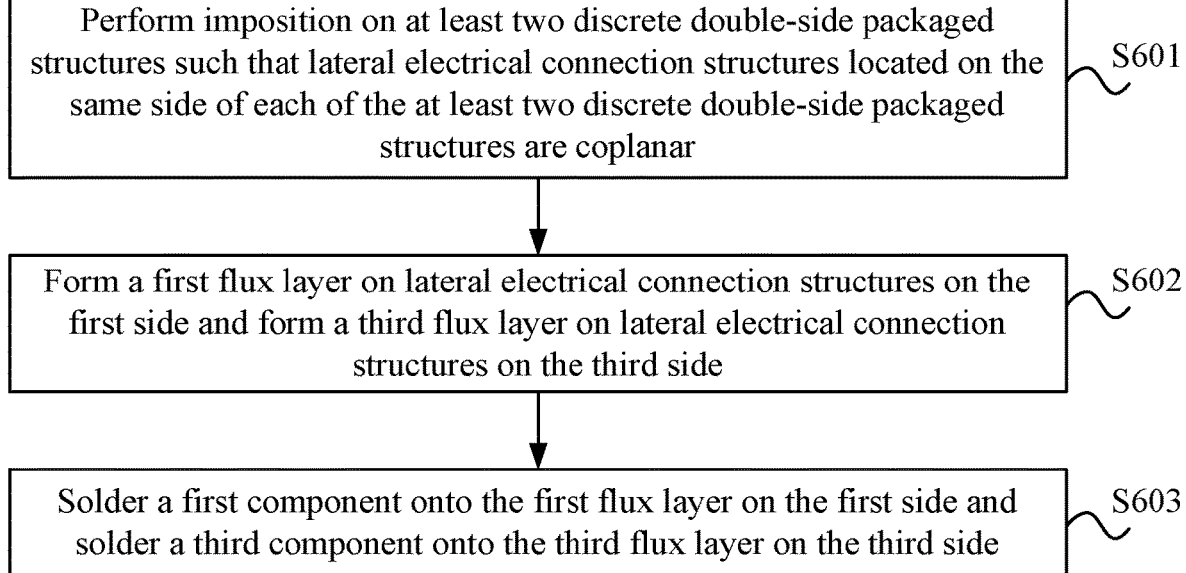
FIG. 13 is a flowchart of a manufacturing method of another laterally mounted and packaged structure according to embodiments of the present disclosure.

FIG. 13 is a flowchart of a manufacturing method of another laterally mounted and packaged structure according to embodiments of the present disclosure. Referring to FIGS. 12 and 13, the manufacturing method of a laterally mounted and packaged structure includes the steps below.

In S601, imposition is performed on at least two discrete double-side packaged structures such that lateral electrical connection structures located on the same side of each of the at least two discrete double-side packaged structures are coplanar.

In S602, a first flux layer 114 is formed on lateral electrical connection structures on a first side, and a third flux layer 118 is formed on lateral electrical connection structures on a third side.

In S603, a first component 113 is soldered onto the first flux layer 114 on the first side, and a third component 117 is soldered onto the third flux layer 118 on the third side.

In this embodiment of the present disclosure, after the first flux layer 114 is formed on the lateral electrical connection structures on the first side, and the third flux layer 118 is formed on the lateral electrical connection structures on the third side, the first component 113 is soldered onto the first flux layer 114 on the first side, and the third component 117 is soldered onto the third flux layer 118 on the third side. Therefore, the first side is mounted with the first component 113, and the third side is mounted with the third component 117 so that a laterally mounted and packaged structure is formed.

Figure 14:
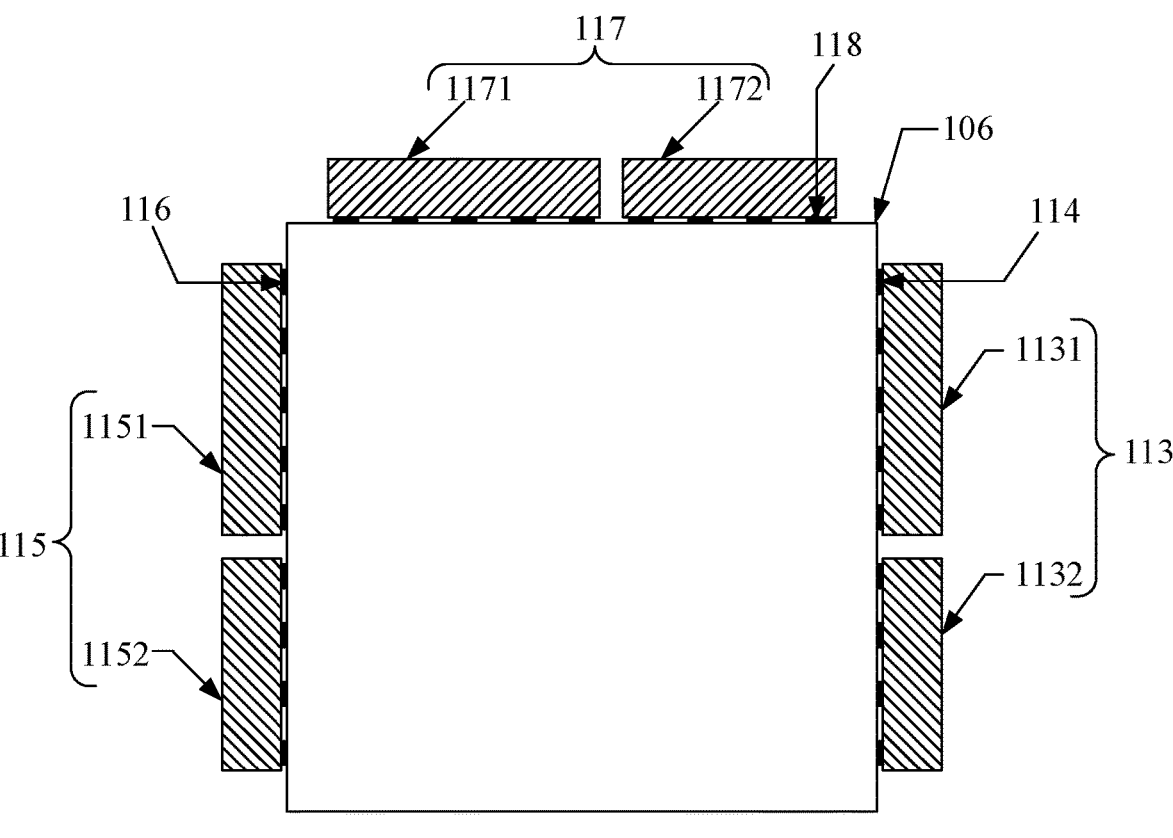
FIG. 14 is a top view illustrating another laterally mounted and packaged structure according to embodiments of the present disclosure.

FIG. 14 is a top view illustrating another laterally mounted and packaged structure according to embodiments of the present disclosure. Referring to FIG. 14, the first side is mounted with the first component 113, the second side is mounted with the second component 115, and the third side is mounted with the third component 117. The first side is opposite to the second side, and the third side is adjacent to the first side and the second side.

In one embodiment, after the first flux layer 114, the second flux layer 116 and the third flux layer 118 may be formed first, the first component 113 is soldered onto the first flux layer 114 on the first side, the second component 115 is soldered onto the second flux layer 116 on the second side, and the third component 117 is soldered onto the third flux layer 118 on the third side.

In another embodiment, after the first flux layer 114 is formed, the first component 113 is soldered onto the first flux layer 114 on the first side; after the second flux layer 116 is formed, the second component 115 is soldered onto the second flux layer 116 on the second side; and after the third flux layer 118 is formed, the third component 117 is soldered onto the third flux layer 118 on the third side.

Figure 15:
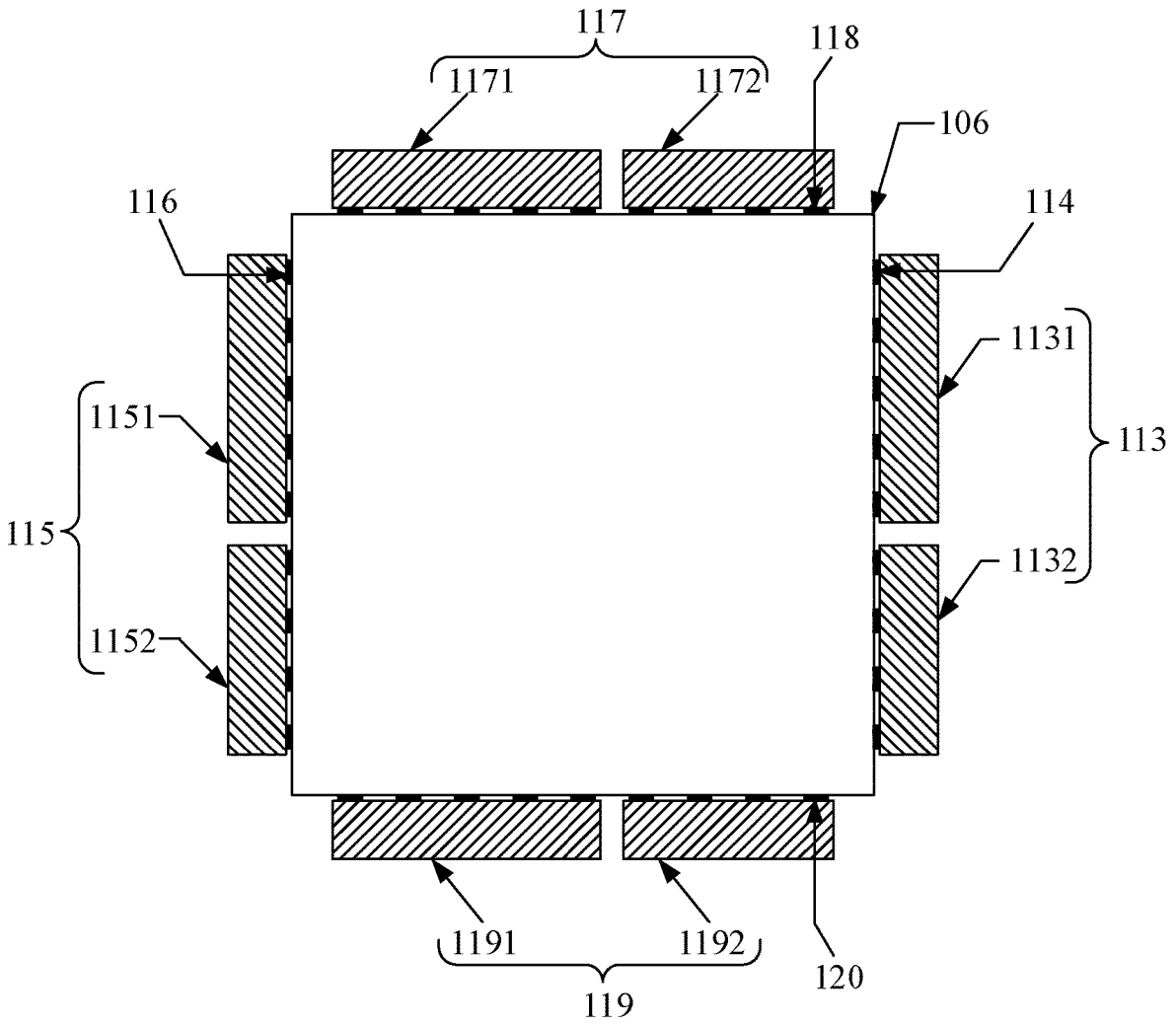
FIG. 15 is a top view illustrating another laterally mounted and packaged structure according to embodiments of the present disclosure.

FIG. 15 is a top view illustrating another laterally mounted and packaged structure according to embodiments of the present disclosure. Referring to FIG. 15, the first side is mounted with the first component 113, the second side is mounted with the second component 115, the third side is mounted with the third component 117, and a fourth side is mounted with a fourth component 119. The first side is opposite to the second side. The third side is opposite to the fourth side, and is adjacent to the first side and the second side.

In one embodiment, after the first flux layer 114, the second flux layer 116, the third flux layer 118 and a fourth flux layer 120 may be formed first, the first component 113 is soldered onto the first flux layer 114 on the first side, the second component 115 is soldered onto the second flux layer 116 on the second side, the third component 117 is soldered onto the third flux layer 118 on the third side, and the fourth component 119 is soldered onto the fourth flux layer 120 on the fourth side.

In another embodiment, after the first flux layer 114 is formed, the first component 113 is soldered onto the first flux layer 114 on the first side; after the second flux layer 116 is formed, the second component 115 is soldered onto the second flux layer 116 on the second side; after the third flux layer 118 is formed, the third component 117 is soldered onto the third flux layer 118 on the third side; and after the fourth flux layer 120 is formed, the fourth component 119 is soldered onto the fourth flux layer 120 on the fourth side.

FIG. 16 is a flowchart of a manufacturing method of a double-side packaged structure according to embodiments of the present disclosure. FIGS. 17 to 22 are views illustrating a manufacturing process of a double-side packaged structure according to embodiments of the present disclosure. Referring to FIGS. 16 to 22, the manufacturing method includes the steps below.

In S701, components are mounted onto the first surface of the first substrate to form lateral electrical connection structures.

Referring to FIG. 17, by use of various mounting technologies, for example, the surface mounting technology, the wire bonding technology and the flip chip technology, the first surface of the first substrate is mounted with the components 103, 104 and 105, and the first structure. This is only for illustration here. In practice, a single mounting technology may be used, or a combination of several mounting technologies may be used.

In S702, the first face of the first substrate is molded.

Figure 18:
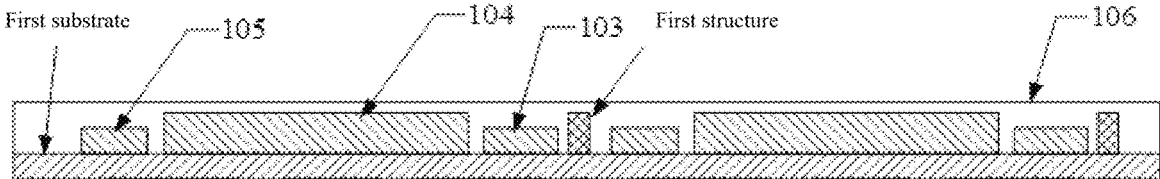

Referring to FIG. 18, when the first face of the first substrate is molded, the components 103, 104 and 105 located on the first face of the first substrate is and the first structure located on the first face of the first substrate are packaged into first face molding glue 106. The first face molding glue 106 may be epoxy resin.

In S703, components are mounted onto the second surface of the first substrate to form lateral electrical connection structures, and the second face of the first substrate is opposite to the first face of the first substrate.

Figure 19:
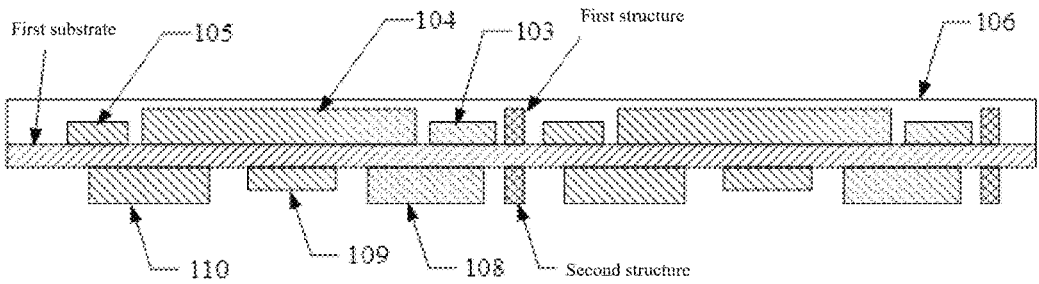

Referring to FIG. 19, by use of technologies, for example, the surface mounting technology, the wire bonding technology and the flip-chip technology, the second surface of the first substrate are mounted with components 108, 109 and 110 and the second structure.

In S704, the second surface of the first substrate is molded.

Figure 20:
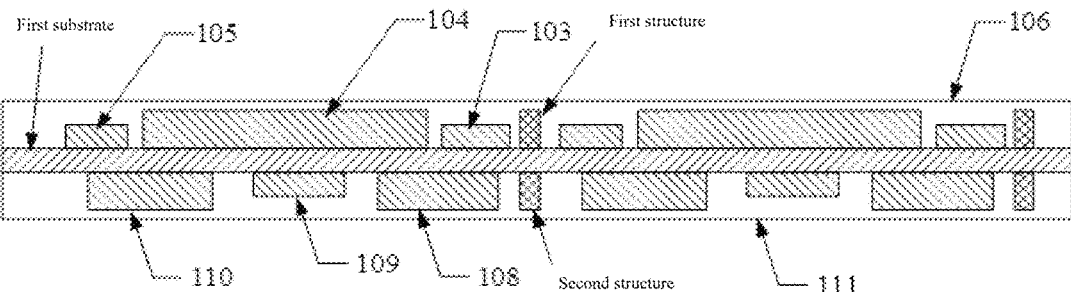

Referring to FIG. 20, when the second surface of the first substrate is molded, the components 108, 109 and 110 located on the second surface of the first substrate and the second structure located on the second surface of the first substrate are packaged into second face molding glue 111. The second face molding glue 111 may be epoxy resin.

In S705, the first substrate, the first structure and the second structure are split to form individual double-side packaged structures, and lateral electrical connection structures are exposed.

Figure 21:
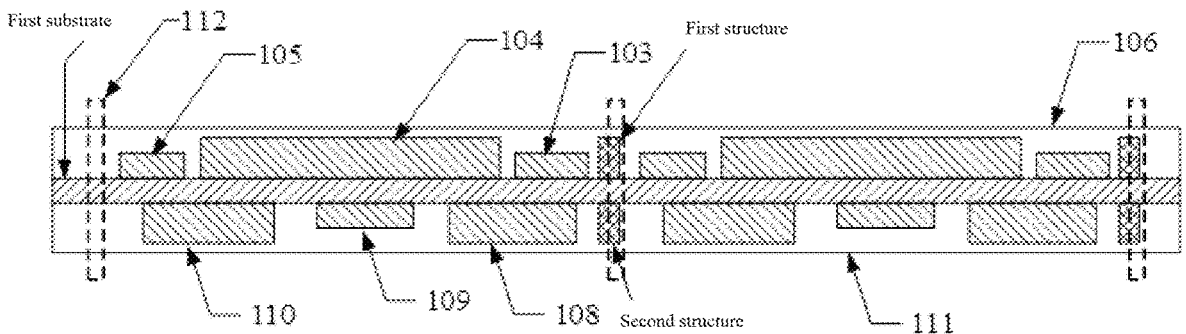
Figure 22:
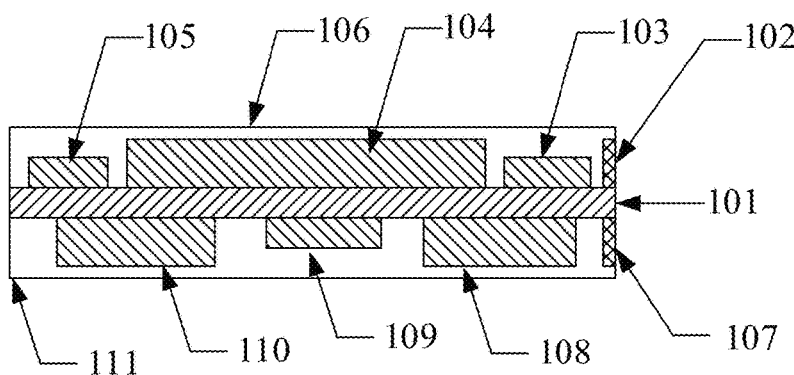

Referring to FIGS. 21 and 22, the first substrate, the first structure, and the second structure are split along the cutting lines 112 as shown in FIG. 21 to form the individual double-side packaged structures as shown in FIG. 22, and one of the double-side packaged structures formed by being split leaves the first-face lateral electrical connection structure 102 and the second-face lateral electrical connection structure 107 exposed. The first substrate is divided into second substrates (namely, substrates 101), the first structure is divided into first-face lateral electrical connection structures 102, the second structure is divided into second-face lateral electrical connection structures 107.

In the manufacturing method of a double-side packaged structure provided by this embodiment of the present disclosure, the components are mounted onto the first surface of the first substrate to form the lateral electrical connection structures, the first face of the first substrate is molded, the components are mounted onto the second surface of the first substrate to form the lateral electrical connection structures, the second face of the first substrate is opposite to the first face of the first substrate, the second surface of the first substrate is molded, the first substrate whose two faces are mounted with the components are split to form individual double-side packaged structures, and the lateral electrical connection structures are exposed.

Embodiments of the present disclosure further provided a laterally mounted and packaged structure manufactured by the preceding manufacturing method. Referring to FIGS. 6 and 7, the laterally mounted and packaged structure includes a double-side packaged structure. The double-side packaged structure includes a substrate 101 and lateral electrical connection structures. The lateral electrical connection structures are respectively formed on a first face of the substrate 101 and a second face of the substrate 101. At least part of the lateral electrical connection structures are located on a first side. The first face is opposite to the second face and is adjacent to the first side. The lateral electrical connection structures include a first-face lateral electrical connection structure 102 and a second-face lateral electrical connection structure 107. The laterally mounted and packaged structure further includes a first component 113 located on the first side. The first component 113 is electrically mounted onto the lateral electrical connection structures on the first side.

The first side of the double-side packaged structure is provided with at least one first component 113. Exemplarily, referring to FIGS. 6 and 7, two first components 113 provided on the first side of the double-side packaged structure are denoted as the first subcomponent 1131 and the second subcomponent 1132. The first subcomponent 1131, the second subcomponent 1132, the components on the first face of the substrate 101 (for example, the components 103,104 and 105) and the components on the second face of the substrate 101 (for example, the components 108,109 and 110) constitute a system-level packaging module having a certain composite functional system.

Embodiments of the present disclosure provide a laterally mounted and packaged structure. One of the lateral electrical connection structures on the substrate 101 is electrically led out to the first side of a respective double-side packaged structure, and the first side is mounted with the first component 113 so that a laterally mounted and packaged structure is formed.

Optionally, referring to FIGS. 6 and 7, the laterally mounted and packaged structure further includes a first flux layer 114. The first flux layer 114 is located between the lateral electrical connection structures (that are, the first-face lateral electrical connection structure 102 and the second-face lateral electrical connection structure 107) and the first component 113, and is used for electrically connecting the lateral electrical connection structures to the first component 113.

Optionally, referring to FIG. 9, the laterally mounted and packaged structure further includes a second flux layer 116 located on the second side and a second component 115 located on the second side. The second flux layer 116 is located between the lateral electrical connection structures and the second component 115 and is used for electrically connecting the lateral electrical connection structures to the second component 115. The second side is opposite to the first side. In this embodiment of the present disclosure, the first side is provided with the first component 113, and the second side is provided with the second component 115 so that a laterally mounted and packaged structure whose two opposite side faces are each mounted with the components is formed.

The second side of the double-side packaged structure is provided with at least one second component 115. Exemplarily, referring to FIG. 8, two second components 115 provided on the second side of the double-side packaged structure are denoted as the third subcomponent 1151 and the fourth subcomponent 1152. The first subcomponent 1131, the second subcomponent 1132, the third subcomponent 1151, the fourth subcomponent 1152, the components on the first face of the substrate 101 (for example, the components 103, 104 and 105) and the components on the second face of the substrate 101 (for example, the components 108, 109 and 110) constitute a system-level packaging module having a certain composite functional system.

Optionally, referring to FIG. 12, the laterally mounted and packaged structure further includes a third flux layer 118 located on the third side and a third component 117 located on the third side. The third flux layer 118 is located between the lateral electrical connection structures and the third component 117 and is used for electrically connecting the lateral electrical connection structures to the third component 117. The third side is adjacent to the first side. In this embodiment of the present disclosure, the first side is provided with the first component 113, and the third side is provided with the third component 117 so that a laterally mounted and packaged structure whose two adjacent side faces are each mounted with the components is formed.

The third side of the double-side packaged structure is provided with at least one third component 117. Exemplarily, referring to FIG. 11, two third components 117 provided on the third side of the double-side packaged structure are denoted as the fifth subcomponent 1171 and the sixth subcomponent 1172. The first subcomponent 1131, the second subcomponent 1132, the fifth subcomponent 1171, the sixth subcomponent 1172, the components on the first face of the substrate 101 (for example, the components 103, 104 and 105) and the components on the second face of the substrate 101 (for example, the components 108, 109 and 110) constitute a system-level packaging module having a certain composite functional system.

Optionally, referring to FIG. 14, the laterally mounted and packaged structure further includes the second flux layer 116 located on the second side, the second component 115 located on the second side, the third flux layer 118 located on the third side and the third component 117 located on the third side. The second flux layer 116 is located between the lateral electrical connection structures and the second component 115 and is used for electrically connecting the lateral electrical connection structures to the second component 115. The third flux layer 118 is located between the lateral electrical connection structures and the third component 117 and is used for electrically connecting the lateral electrical connection structures to the third component 117. The second side is opposite to the first side. The third side is adjacent to the first side and the second side. In this embodiment of the present disclosure, the first side is provided with the first component 113, the second side is provided with the second component 115, and the third side is provided with the third component 117 so that a laterally mounted and packaged structure whose three side faces are each mounted with the components is formed.

Exemplarily, referring to FIG. 14, the first subcomponent 1131, the second subcomponent 1132, the third subcomponent 1151, the fourth subcomponent 1152, the fifth subcomponent 1171, the sixth subcomponent 1172, the components on the first face of the substrate 101 (for example, the components 103, 104 and 105) and the components on the second face of the substrate 101 (for example, the components 108, 109 and 110) constitute a system-level packaging module having a certain composite functional system.

Optionally, referring to FIG. 15, the laterally mounted and packaged structure further includes the second flux layer 116 located on the second side, the second component 115 located on the second side, the third flux layer 118 located on the third side, the third component 117 located on the third side, the fourth flux layer 120 located on the fourth side and the fourth component 119 located on the fourth side. The second flux layer 116 is located between the lateral electrical connection structures and the second component 115 and is used for electrically connecting the lateral electrical connection structures to the second component 115. The third flux layer 118 is located between the lateral electrical connection structures and the third component 117 and is used for electrically connecting the lateral electrical connection structures to the third component 117. The fourth flux layer 120 is located between the lateral electrical connection structures and the fourth component 119 and is used for electrically connecting the lateral electrical connection structures to the fourth component 119. The second side is opposite to the first side. The fourth side is opposite to the third side. The third side is adjacent to the first side and the second side. In this embodiment of the present disclosure, the first side is provided with the first component 113, the second side is provided with the second component 115, the third side is provided with the third component 117, and the fourth side is provided with the fourth component 119 so that a laterally mounted and packaged structure whose four side faces are each mounted with the components is formed.

The fourth side of the double-side packaged structure is provided with at least one fourth component 119. Exemplarily, referring to FIG. 14, two fourth components 119 provided on the fourth side of the double-side packaged structure are denoted as the seventh subcomponent 1191 and the eighth subcomponent 1192. The first subcomponent 1131, the second subcomponent 1132, the third subcomponent 1151, the fourth subcomponent 1152, the fifth subcomponent 1171, the sixth subcomponent 1172, the seventh subcomponent 1191, the eighth subcomponent 1192, the components on the first face of the substrate 101 (for example, the components 103, 104 and 105) and the components on the second face of the substrate 101 (for example, the components 108, 109 and 110) constitute a system-level packaging module having a composite functional system.

Figure 23:
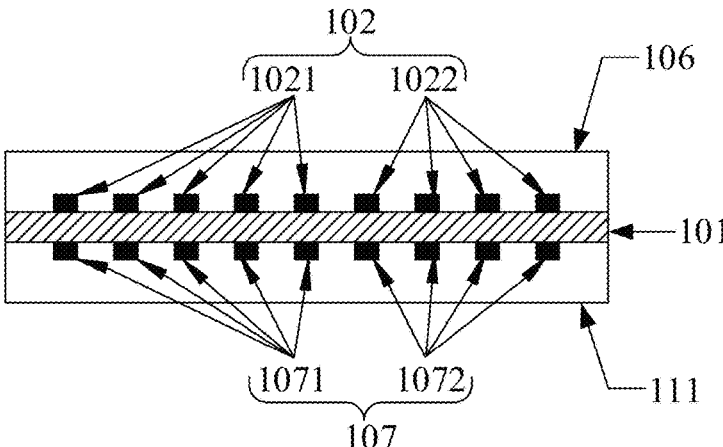
FIG. 23 is a side view of a double-side packaged structure according to embodiments of the present disclosure.

FIG. 23 is a side view of a double-side packaged structure according to embodiments of the present disclosure. Referring to FIGS. 6, 7 and 23, the lateral electrical connection structures include a metal column. The metal column is electrically connected to the substrate 101. The metal column may include a copper column, a tin column and an alloy column.

Exemplarily, referring to FIG. 23, the first-face lateral electrical connection structure 102 includes a first metal subcolumn 1021 and a second metal subcolumn 1022, and the second-face lateral electrical connection structure 107 includes a third metal subcolumn 1071 and a fourth metal subcolumn 1072. The total number of the first metal subcolumns 1021 and the third metal subcolumns 1071 is equal to the number of solder balls (or pads) at the bottom of the first subcomponent 1131. The distance between adjacent first metal subcolumns 1021 and the distance between adjacent third metal subcolumns 1071 may be disposed according to the distance between the solder balls (or the pads) at the bottom of the first subcomponent 1131. The total number of the second metal subcolumns 1022 and the fourth metal subcolumns 1072 is equal to the number of solder balls (or pads) at the bottom of the second subcomponent 1132. The distance between adjacent second metal subcolumns 1022 and the distance between adjacent fourth metal subcolumns 1072 may be disposed according to the distance between the solder balls (or the pads) at the bottom of the second subcomponents 1132.

Figure 24:
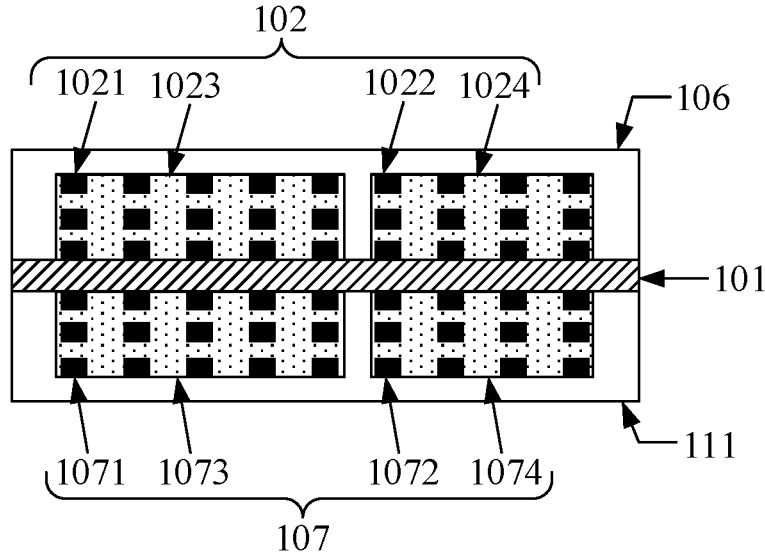
FIG. 24 is a side view of another double-side packaged structure according to embodiments of the present disclosure.

FIG. 24 is a side view of another double-side packaged structure according to embodiments of the present disclosure. Referring to FIGS. 6, 7 and 24, the lateral electrical connection structures include an adapter substrate and a metal column. The metal column is electrically connected to the substrate 101 via the adapter substrate.

Exemplarily, referring to FIG. 24, the first-face lateral electrical connection structure 102 includes the first metal subcolumn 1021, the second metal subcolumn 1022, a first adapter substrate 1023 and a second adapter substrate 1024, and the second-face lateral electrical connection structure 107 includes the third metal subcolumn 1071, the fourth metal subcolumn 1072, a third adapter substrate 1073 and a fourth adapter substrate 1074. The first metal subcolumn 1021 is electrically connected to the substrate 101 via the first adapter substrate 1023. The second metal subcolumn 1022 is electrically connected to the substrate 101 via the second adapter substrate 1024. The third metal subcolumn 1071 is electrically connected to the substrate 101 via the third adapter substrate 1073. The fourth metal subcolumn 1072 is electrically connected to the substrate 101 via the fourth adapter substrate 1074. The total number of the first metal subcolumns 1021 and the third metal subcolumns 1071 is equal to the number of the solder balls (or the pads) at the bottom of the first subcomponent 1131. The distance between the adjacent first metal subcolumns 1021 and the distance between the adjacent third metal subcolumns 1071 may be disposed according to the distance between the solder balls (or the pads) at the bottom of the first subcomponent 1131. The total number of the second metal subcolumns 1022 and the fourth metal subcolumns 1072 is equal to the number of the solder balls (or the pads) at the bottom of the second subcomponent 1132. The distance between the adjacent second metal subcolumns 1022 and the distance between the adjacent fourth metal subcolumns 1072 may be disposed according to the distance between the solder balls (or the pads) at the bottom of the second subcomponent 1132.

Exemplarily, referring to FIG. 24, on the side face of the substrate 101, in the plane perpendicular to the substrate 101, multiple first metal subcolumns 1021 arranged in an array are electrically connected to the substrate 101 via the first adapter substrate 1023; multiple second metal subcolumns 1022 arranged in an array are electrically connected to the substrate 101 via the second adapter substrate 1024; multiple third metal subcolumns 1071 arranged in an array are electrically connected to the substrate 101 via the third adapter substrate 1073; and multiple fourth metal subcolumns 1072 arranged in an array are electrically connected to the substrate 101 via the fourth adapter substrate 1074. Therefore, an arrayed leading-out pad is formed in the plane perpendicular to the substrate 101.

Optionally, in the direction perpendicular to the substrate 101, the first-face lateral electrical connection structure 102 has the height less than the thickness of the first face molding glue 106, and the perpendicular distance between the first-face lateral electrical connection structure 102 and the first face molding glue 106 is greater than 0.05 mm. In the direction perpendicular to the substrate 101, the second-face lateral electrical connection structure 107 has the height less than the thickness of the second face molding glue 111, and the perpendicular distance between the second-face lateral electrical connection structure 107 and the second face molding glue 111 is greater than 0.05 mm.

Optionally, in the direction perpendicular to the substrate 101, the first component 113 (the first subcomponent 1131 and the second subcomponent 1132 are included) has a thickness less than the perpendicular distance between the first face molding glue 106 and the second face molding glue 111.

In the manufacturing method of a laterally mounted and packaged structure provided by the embodiments of the present disclosure, the imposition is performed on the at least two discrete double-side packaged structures such that the lateral electrical connection structures located on the same side of each of the at least two discrete double-side packaged structures are coplanar, one of the lateral electrical connection structures on the substrate is electrically led out to the first side of a respective double-side packaged structure, and the first side is mounted with the first component so that a laterally mounted and packaged structure is formed.

What is claimed is:

1. A manufacturing method of a laterally mounted and packaged structure, comprising:
   mounting first structures onto a first face of a first substrate;
   molding the first face of the first substrate;
   mounting second structures onto a second face of the first substrate; wherein each of the first structures is aligned with a respective one of the second structures in a thickness direction of the first substrate;
   molding the second face of the first substrate; wherein the second face of the first substrate is opposite to the first face of the first substrate;
   splitting the first substrate, the first structures and the second structures in the thickness direction of the first substrate to form at least two discrete double-side packaged structures such that the first substrate is divided into second substrates, each of the first structures is divided into first-face lateral electrical connection structures, each of the second structures is divided into second-face lateral electrical connection structures; wherein each of the at least two discrete double-side packaged structures comprises one second substrate of the second substrates, one first-face lateral electrical connection structure of the first-face lateral electrical connection structures, and one second-face lateral electrical connection structure of the second-face lateral electrical connection structures;
   performing imposition on the at least two discrete double-side packaged structures such that the first-face lateral electrical connection structures and the second-face lateral electrical connection structures located on a first side of each of the at least two discrete double-side packaged structures are coplanar; wherein the one first-face lateral electrical connection structure and the one second-face lateral electrical connection structure are respectively formed on a first face and a second face of the one second substrate and are coplanar on the first side of each of the at least two discrete double-side packaged structures, the first face is opposite to the second face on each of the at least two discrete double-side packaged structures, and each of the first face and the second face is adjacent to the first side on each of the at least two discrete double-side packaged structures, and electrically mounting a first component on the first side of each of the at least two discrete double-side packaged structures to form the laterally mounted and packaged structure, wherein the first component is connected to both of the one first-face lateral electrical connection structure and the one second-face lateral electrical connection structure in each of the at least two discrete double-side packaged structures.

2. The manufacturing method according to claim 1, before electrically mounting the first component on the first side of each of the at least two discrete double-side packaged structures to form the laterally mounted and packaged structure, the manufacturing method further comprising:
   forming flux layer on the one first-face lateral electrical connection structure and the one second-face lateral electrical connection structure;
   wherein electrically mounting the first component on the first side of each of the at least two discrete double-side packaged structures to form the laterally mounted and packaged structure comprises:
   soldering the first component onto the flux layer on the first side of each of the at least two discrete double-side packaged structures.

3. The manufacturing method according to claim 1, after performing the imposition on the at least two discrete double-side packaged structures such that the first-face lateral electrical connection structures and the second-face lateral electrical connection structures located on the first side of each of the at least two discrete double-side packaged structures are coplanar, the manufacturing method further comprising:
   forming a flux layer on lateral electrical connection structures on a second side of each of the at least two discrete double-side packaged structures; and
   soldering a second component onto the flux layer on the second side;
   wherein the second side is opposite to the first side on each of the at least two discrete double-side packaged structures.

4. The manufacturing method according to claim 1, after performing the imposition on the at least two discrete double-side packaged structures such that the first-face lateral electrical connection structures and the second-face lateral electrical connection structures located on the first side of each of the at least two discrete double-side packaged structures are coplanar, the manufacturing method further comprising:
   forming a flux layer on lateral electrical connection structures on a second side of each of the at least two discrete double-side packaged structures; and
   soldering a second component onto the flux layer on the second side;
   wherein the second side is adjacent to the first side on each of the at least two discrete double-side packaged structures.

5. The manufacturing method according to claim 1, wherein performing the imposition on the at least two discrete double-side packaged structures such that the first-face lateral electrical connection structures and the second-face lateral electrical connection structures located on the first side of each of the at least two discrete double-side packaged structures are coplanar comprises:
   placing the at least two discrete double-side packaged structures into a jig, and performing the imposition by use of the jig such that the one first-face lateral electrical connection structure and the one second-face lateral electrical connection structure located on the first side of each of the at least two discrete double-side packaged structures are coplanar.

6. The manufacturing method according to claim 5, wherein the is second substrates are perpendicular to a work surface of the jig.

7. The manufacturing method according to claim 5, after electrically mounting the first component on the first side of each of the at least two discrete double-side packaged structures to form the laterally mounted and packaged structure, the manufacturing method further comprising:

moving the laterally mounted and packaged structure away from the jig, wherein the laterally mounted and packaged structure is formed by being laterally mounted.

\* \* \* \* \*